US007615932B2

United States Patent
Abe et al.

(10) Patent No.: US 7,615,932 B2
(45) Date of Patent: Nov. 10, 2009

(54) REFERENCE CURRENT GENERATING CIRCUIT, ORGANIC EL DRIVE CIRCUIT AND ORGANIC EL DISPLAY DEVICE EMPLOYING IT

(75) Inventors: Shinichi Abe, Kyoto (JP); Hiroshi Yaguma, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 11/719,997

(22) Filed: Apr. 28, 2008

(65) Prior Publication Data

US 2008/0272710 A1 Nov. 6, 2008

(30) Foreign Application Priority Data

Nov. 24, 2004 (JP) .............................. 2004-338550

(51) Int. Cl.
*G09G 3/10* (2006.01)
(52) U.S. Cl. ...................... 315/169.3; 345/76; 345/204
(58) Field of Classification Search .............. 315/169.1, 315/169.2, 169.3; 345/76, 77, 84, 204, 211–214
See application file for complete search history.

(56) References Cited

U.S. PATENT DOCUMENTS

| 6,756,738 | B2* | 6/2004 | Maede et al. ............. 315/169.1 |
| 6,972,526 | B2* | 12/2005 | Abe ........................ 315/169.3 |
| 7,084,577 | B2* | 8/2006 | Maede et al. ............. 315/169.4 |
| 2007/0278965 | A1* | 12/2007 | Maede et al. ............. 315/169.3 |

* cited by examiner

*Primary Examiner*—Douglas W Owens
*Assistant Examiner*—Jimmy T Vu
(74) *Attorney, Agent, or Firm*—Mattingly & Malur, P.C.

(57) ABSTRACT

An organic EL display device having an organic EL drive circuit has a reference current generation circuit that switches the column line drive in response to changing of the dot arrangement of R, G and B through changeover switch circuits. Three D/A converter blocks constituted by a plurality of switch circuits and a plurality of output side transistors of a current mirror circuit are provided to produce reference currents for R, G and B that are selectively switched by a first, a second and a third changeover switch circuit. As a result, the D/A converter blocks corresponding to the respective terminal pins dynamically produce drive currents for the respective terminal pins so as to correspond to the dot arrangement of R, G and B on the organic EL panel.

18 Claims, 3 Drawing Sheets

REFERENCE CURRENT GENERATING CIRCUIT, ORGANIC EL DRIVE CIRCUIT AND ORGANIC EL DISPLAY DEVICE EMPLOYING IT

FIELD OF THE INVENTION

The present invention relates to a reference current generation circuit, an organic EL drive circuit and an organic EL display device using the same, and more specifically, with regard to a pixel arrangement (dot arrangement) of three primary colors of R (red),G (green) and B (blue), when the order of dot arrangement of R, G and B on one horizontal line changes on a display screen in a manner such as a diagonal arrangement, a delta arrangement and a rectangular arrangement in response to a line scanning at a row side of one horizontal line (scanning in vertical direction of one horizontal line), the present invention is for facilitating switching of column line drive in response to the changing dot arrangement of R, G and B through provision of changeover switch circuits in a reference current generation circuit and relates to the reference current generation circuit which almost prevents an increase of an occupation area of a current drive circuit in an IC even if such changeover switch circuits are added. Further, the present invention relates to an organic EL drive circuit for a color display which permits to reduce an occupation area of a current drive circuit in an IC even if changeover switch circuits for switching the column line drive corresponding to dot arrangement of R, G and B, and to an organic El display device.

BACKGROUND ART

For an organic EL display panel in an organic EL display device which is mounted such as on a cellular phone, PHS, DVD player and PDA (Personal Digital Assistant), a full color QVGA has been proposed and which is now at a stage of being reduced into practice. Although the number of pins in column direction required for the QVGA is 120 pins for respective R, G and B and is 360 pins in total, the number of pins for such as an organic EL display device used for TV further increases so as to constitute an organic EL panel having high resolution. Further, an organic EL panel for a cellular phone is keenly demanded to mount an organic EL panel having further high resolution on the device.

In the full color display, the three pixels of R, G and B correspond to one pixel of monochrome. When enhancing an image quality under high resolution, instead of currently used stationary type stripe location in a dot arrangement (sub-pixel arrangement) of R, G and B in which R, G and B are allocated in order to the respective column lines, the organic EL display device is required to use a dot arrangement of R, G and B such as a diagonal arrangement, a delta arrangement and a rectangular arrangement which is used for a current liquid crystal display and is necessitated a dynamic current drive to meet the same (non-patent document 1).

Non-patent document 1: Dictionary of Terminology on Liquid Crystal Display Manufacturing Device (Edited by Japanese Semiconductor Manufacturing Device Association)

Tasks to be Resolved by the Invention

Since there are differences in light emission sensitivity of R, G and B, such as in a diagonal arrangement, a delta arrangement and a rectangular arrangement, even if the level of light emission intensity of organic EL elements is the same, it is necessary for a same column line to generate drive current corresponding to R, G and B which is determined depending on the dot arrangement. The drive current has to be generated dynamically in response to line scanning (scanning in vertical direction of one horizontal line) at row side of one horizontal line.

For this purpose, it is considered to provide a multiplexer for switching R, G and B before output pins and to generate the drive current for R, G and B while switching the same in response to the line scanning at row side of one horizontal line. However, if doing so, multiplexers in the number corresponding to the number of the respective output pins are necessitated. For this reason, there arises a problem that the occupation area for the current drive circuit is increased correspondingly and the number of drive pins per one IC is limited. When such IC driver is used for increasing resolution, there arises a problem that such IC drivers in many numbers are necessitated.

An object of the present invention is to resolve such problems in the conventional art, to facilitate switching of column line drive in response to the changing dot arrangement of R, G and B through provision of changeover switch circuits in a reference current generation circuit and to provide the reference current generation circuit which almost prevents an increase of an occupation area of a current drive circuit in an IC even if such changeover switch circuits are added.

Another object of the present invention is to provide an organic EL drive circuit or an organic El display device suitable for an organic EL panel of a color display under high resolution which permits to reduce an occupation area of a current drive circuit in an IC even if changeover switch circuits for switching column line drive corresponding to dot arrangement of R, G and B are added.

Measure for Resolving the Tasks

A constitution of a reference current generation circuit according to a first invention which achieves such objects is provided with a first, a second and a third D/A converter block, each of which is constituted by a plurality of switch circuits and a plurality of output side transistors of a current mirror circuit, provided for one of corresponding three primary colors of R, G and B and respectively generates converted analog current as a reference current, a first changeover switch circuit which selects one of respective reference currents corresponding to R, G and B, a second changeover switch circuit which selects another of respective reference currents corresponding to R, G and B, a third changeover switch circuit which selects the remaining one of respective reference currents corresponding to R, G and B and a control circuit for performing a control which successively switches in response to line scanning for a display screen the selection of the reference current by the first, the second and the third changeover switch circuit so that drive currents generated correspondingly to respective terminal pins correspond to a dot arrangement of R, G and B in an organic EL panel.

With respect to a constitution of an organic EL drive circuit or an organic EL display device using the same according to a second invention, the organic EL drive circuit which respectively produces drive current correspondingly to respective many terminal pins in an organic EL panel and current drives the organic EL panel is provided with a reference current generation circuit which respectively generates reference current corresponding to the display three primary colors of R, G and B, a first, a second and a third current mirror circuit, first D/A converter blocks in many numbers which are constituted by a plurality of first switch circuits and a plurality of output side transistors of the respective first, second and third current mirror circuit, generate converted analog current as a drive current or a current on which the drive current is generated, and are provided for respective many terminal pins, a first changeover switch circuit which selects one of the respective reference current corresponding to R, G and B and supplies the same to the input side transistors for the first current mirror circuit, a second changeover switch circuit which selects another of the respective reference current corresponding to R, G and B and supplies the same to the input side transistors for the second current mirror circuit, a third changeover switch circuit which selects the remaining one of the respective reference current corresponding to R, G and B and supplies the same to the input side transistors for the third current mirror circuit and a control circuit for performing a control which successively switches in response to line scanning for a display screen the selection of the reference current by the first, the second and the third changeover switch circuit, thereby, drive currents generated correspondingly to respective terminal pins are output to the respective terminal pins through the switching control of the control circuit so as to corresponds a dot arrangement of R, G and B in the organic EL panel.

ADVANTAGES OF THE INVENTION

According to the first invention, with the single current mirror circuit three D/A converter blocks constituted by the plurality of switch circuits and the plurality of output side transistors for the current mirror are provided so as to correspond to R, G and B, and the D/A blocks respectively generate reference current for R, G and B. The generated these reference currents are selected by the first, second and third changeover switch circuit and the control circuit performs the switching control of the first, second and third changeover switch circuit in response to the line scanning (which corresponds to line scanning at row side for one horizontal line) for the display screen so as to correspond to the dot arrangement of R, G, thereby, the selection of the reference current is performed dynamically corresponding to the dot arrangement of R, G and B on the organic EL panel and the drive current is produced in response to the selection.

Further, the production of the drive current is, for example, effected simply by supplying the respective reference currents selected by the first, second and third changeover switch circuit to the D/A converter circuit of current mirror circuit structure respectively provided for the respective terminal pins of R, G and B.

In this instance, according to the first invention, instead of respectively generating the respective reference currents for R, G and B with three current mirror circuits corresponding to R, G and B as the reference current generation circuit, such is performed with three D/A converter blocks in the single current mirror circuit.

Although the first, second and third switch changeover circuit are provided, these can be respectively constituted by a plurality of, usually about three, switch transistors (a transmission gate or other analog switch). Since the reference current is a minute current, the occupation area of the switch transistors can be limited. An increase of the occupation area by the plurality of these switch transistors can be substantially compensated by reducing the input side transistors in the current mirror circuit by two.

This is because, the channel width and the channel length, for example, of nine transistors for the switch operation turning ON/OFF the minute reference current are short enough. On the other hand, the cannel width and the channel length of transistors of current output are generally wide and long in comparison with the transistors of switch operation. The occupation area of the transistors of current output is much more larger than that of the transistors of switch operation.

As a result, a substantial increase of the occupation area of the reference current generation circuit for R, G and B as a whole can almost be avoided even with the provision of the first, second and third changeover switch circuit and a reference current generation circuit suitable for high resolution display can be realized.

According to the second invention, D/A converter circuits for three current mirror circuits each including the D/A converter blocks corresponding to the respective terminal pins are provided at the post-stage of the reference current generation circuit generating the reference current for R, G and B. Thus, the respective reference current corresponding to R, G and B is selectively switched by the first, second and third changeover switch circuit and is supplied to the first, second and third current mirror circuit to drive the same respectively and the D/A converter blocks corresponding to the respective terminal pins dynamically produce the drive current or the current on which the drive current is generated, for the respective terminal pins so as to correspond to the dot arrangement of R, G and B on the organic EL panel.

The reference current generation circuit in this instance is not necessarily required to be a circuit being respectively provided with three current mirror circuits for R, G and B and respectively generating the reference current for R, G and B. The reference current generation circuit can be constituted by a single current mirror circuit using a common input side transistor as explained above. An embodiment, which will be explained below is an example of the later one.

According to the second invention, since the first, second and third current mirror circuit are provided with the respective first D/A converter blocks corresponding to the respective terminal pins for R, G and B, the occupation area of the D/A converter circuits can be reduced.

The respective first D/A converter blocks corresponding to the respective terminal pins are respectively constituted by the plurality of output side transistors in the respective first third current mirror circuits and the plurality of the first switches. Thus the respective drive current or the current on which the drive current is generated, is obtained from the respective first D/A converter blocks. The control circuit performs, in the same manner as above, the switching control of the changeover switch circuits in response to the line scanning for the display screen so that the reference current selection for R, G and B corresponds to the dot arrangement of R, G and B on the organic EL panel.

Thereby, according to the first and second inventions, since the number of the changeover switch circuits is limited to that required only for selecting the reference current for R, G and B so that the switch circuits correspond to the dot arrangement of R, G and B, the occupation area thereof can be reduced in comparison with the instance where the switch circuits are provided corresponding to the respective terminal pins.

Further, according to the second invention, instead of respectively providing the current switching type D/As for the current mirror circuits corresponding to the terminal pins and generating converted analog current corresponding to the terminal pins, since the three current mirror circuits corresponding to R, G and B are provided and the D/A converter blocks with a plurality of output side transistors using a common input side transistor in the respective current mirror circuits are provided as the first D/A converter blocks corresponding to the terminal pins, like the first invention the occupation area by these circuits can be reduced.

As a result, the switching of the column line for R, G and B corresponding to the dot arrangement for R, G and B can be performed easily, the occupation area of the current drive circuit in an IC is reduced and an organic EL drive circuit and an organic EL display device suitable for high resolution display can be realized.

BEST MODES FOR CARRYING OUT THE INVENTION

FIG. 1 is a block diagram primarily of a column driver in an active matrix type organic EL panel of a diagonal dot arrangement according to an embodiment to which an organic EL drive circuit of the present invention is applied, FIG. 2 is a view for explaining a pixel arrangement (dot arrangement) in the diagonal arrangement and FIG. 3 is a timing chart of the column driver when driving the active matrix type organic EL panel. In FIG. 1, Numeral 10 is a column IC driver (herein below simply called as a column driver) serving as an organic EL drive circuit for driving an organic EL panel. The column driver 10 is constituted by such as a reference current source 1 provided in common for R, G and B, a current inverting circuit 2, a white balance adjusting circuit 3, an RGB changeover switch circuit 4, a D/A converter circuit (D/A) 5 and a reset voltage generation circuit 6. A display device is constituted by such as the column driver 10, an active matrix type organic EL panel 11 of diagonal dot arrangement, a control circuit 12 and MPU 13, etc.

The white balance adjusting circuit 3 is a current switching type D/A constituted by a current mirror circuit, which switches and selects an output current of a plurality of output side transistors by a plurality of switch circuits. The white balance adjusting circuit 3 serves as a reference current generation circuit provided corresponding to R, G and B and includes a white balance adjusting circuit 3R for R, a white balance adjusting circuit 3G for G and a white balance adjusting circuit 3B for B. The white balance adjusting circuit 3 receives a reference current Iref from the reference current source 1 via the current inverting circuit 2 and respectively generates for R, G and B reference currents Ir, Ig and Ib corresponding to white balance adjusted R, G and B.

Further, the reference current generation circuit for R, G and B is not limited to this white balance adjusting circuit 3, but an entire circuit including the reference current source 1, the current inverting circuit 2 and the white balance adjusting circuit 3 can be treated as the reference current generation circuit generating the reference currents Ir, Ig and Ib.

The white balance adjusting circuit 3R, the white balance adjusting circuit 3G and the white balance adjusting circuit 3B are respectively constituted by current switching type 8 bits D/A converter blocks 30R, 30G and 30B provided respectively corresponding to R, G and B and a register 31 provided in common therefor.

The D/A converter blocks 30R, 30G and 30B are respectively constituted by output side transistors in a single current mirror circuit and a plurality of switch circuits and the plurality of output side transistors are respectively constituted by a plurality of P channel output side transistors Trb~Trn, a plurality of P channel output side transistors Tgb~Tgn and a plurality of P channel output side transistors Tbb~Tbn. Further, the D/A converter blocks 30R, 30G and 30B respectively include a plurality of switch circuits SW for switching current of the output side transistors.

An input side transistor Taa in the current mirror circuit provided in common for the output side transistors in these D/A converter blocks 30R, 30G and 30B receives the reference current Iref from the reference current inverting circuit 2 and is driven thereby. The respective D/A converter blocks 30R, 30G and 30B perform D/A conversion according to respective set data corresponding to R, G and B which are set in the register 31 and the reference current Iref and generate respectively the reference currents Ir, Ig and Ib as the converted analog current at respective output terminals 32R, 32G and 32B.

Further, when a power source of the device is turned ON, set data with regard to reference current values for R, G and B are sent out to the register 31 and stored therein. Thereby, the predetermined reference currents Ir, Ig and Ib which are subjected to the white balance adjustment are respectively generated at the white balance adjusting circuit 3R, the white balance adjusting circuit 3G and the white balance adjusting circuit 3B.

The current inverting circuit 2 is constituted by a current mirror circuit formed by an N channel input side MOS transistor TN1 and an N channel output side MOS transistor TN2. The drain of the diode connected transistor TN1 is connected to the output of the reference current source 1 and receives the reference current therefrom. The source thereof is grounded. The drain of the transistor TN2 is connected to the drain of the transistor Taa in the white balance adjusting circuit 3 and the source thereof is grounded. The reference current source 1 is connected to a power source line of the device +VDD and receives an electric power supply. The reference current Iref output from the reference current source 1 is a current serving as a source for generating the respective reference currents corresponding to R, G and B.

Thereby, the reference current Iref discharged from the reference current source 1 is input to the current inverting circuit 2 and after being inverted the current flow direction from discharge to sink, the flow direction inverted current is input as a mirror current to the white balance adjusting circuit 3. The sink current is supplied to the drain of the input side transistor Taa in the current mirror circuit and the input side transistor Taa is driven by the reference current Iref.

The RGB changeover switch circuit 4 is constituted by nine analog switches (transmission gate) 41a, 41b, 41c 42a, 42b, 42c, 43a, 43b and 43c which are disposed between the white balance adjusting circuit 3 and the D/A 5.

The D/A 5 is constituted by three D/As 51, 52 and 53. The D/A 51, D/A 52 and D/A 53 are respectively a current switching type D/A constituted by current mirror circuits. D/A converter blocks 51a, 52a, 53a~D/A converter blocks 51n, 52n, 53n in these D/As are n (n is total pin number) pieces of 8 bits D/A converter blocks for respective N channel input side MOS transistors Ta1~Ta3, each constituted by output side transistors Tb~Tn provided respectively corresponding to respective output terminal pins Xa, Xb, . . . Xn (the respective output terminal pins correspond to respective terminal pins Xa, Xb, . . . Xn at the column side of the organic EL panel and are connected thereto).

The respective output side transistors Tb~Tn in the D/A converter blocks 51a, 51b, . . . 51n (not shown) are current mirror connected to a common input side transistor Ta1, the respective output side transistors Tb~Tn in the D/A converter blocks 52a, 52b, . . . 52n (not shown) are current mirror connected to a common input side transistor Ta2 and the respective output side transistors Tb~Tn in the D/A converter blocks 53a, 53b (not shown), . . . 53n are current mirror connected to a common input side transistor Ta3. The sources of the respective input side transistors Ta~Tn are respectively grounded.

Respective output terminals 5a in the D/A converter blocks 51a~51n are respectively connected in order via analog switches 54 provided respectively corresponding thereto to 3i+1 (i is an integer from 0 to n/3) th among the respective output terminal pins Xa~Xn (herein below will be called as terminal pins Xa~Xn). Respective output terminals 5a in the D/A converter blocks 52a~52n are respectively connected in order via analog switches 54 provided respectively corresponding thereto to 3i+2th among the respective output terminal pins Xa~Xn and respective output terminals 5a in the D/A converter blocks 53a~53n are respectively connected in order via analog switches 54 provided respectively corresponding thereto to 3i+3th among the respective output terminal pins Xa~Xn.

Namely, the respective output terminals 5a in the D/A converter blocks 51a~51n are connected alternatively to the terminal pins Xa~Xn in two pins apart.

To the respective converter blocks in the D/A 51, D/A 52 and the D/A 53 of the D/A 5, display data corresponding to the terminal pins sent out respectively to display data registers 56a~56n from the MPU 13 and stored therein are respectively supplied. Thereby, analog converted currents corresponding to the display data are generated at the output terminals 5a of the D/A converter blocks 51a, 52a, 53a~D/A converter blocks 51n, 52n, 53n.

Further, the display data transfer from the MPU 13 to the display data registers 56a~56n is effected when the power source is turned ON.

One terminals of analog switches 41a, 41b and 41c in the RGB changeover switch circuit 4 are connected in common to the drain terminal of the input side transistor Ta1 and the other terminals thereof are respectively connected to the respective output terminals 32R, 32B and 32G of the white balance adjusting circuits 30R, 30B and 30G. One terminals of analog switches 42a, 42b and 42c are connected in common to the drain terminal of the input side transistor Ta2 and the other terminals thereof are respectively connected to the respective output terminals 32G, 32R and 32B. One terminals of analog switches 43a, 43b and 43c are connected in common to the drain terminal of the input side transistor Ta3 and the other terminals thereof are respectively connected to the respective output terminals 32B, 32G and 32R.

The reset voltage generation circuit 6 shown in right side of the drawing is a programmable constant voltage generation circuit and is constituted by a voltage type D/A converter circuit and a register 61. The reset voltage generation circuit 6 receives set data set at the register 61 and after D/A converting the same, generates a reset voltage Vr at an output terminal 6a of the reset voltage generation circuit 6. The output terminal 6a is connected to the respective terminal pins Xa~Xn via respective analog switches 55 provided so as to correspond to the respective terminal pins Xa~Xn.

Further, the data set with regard to the reset voltage Vr are transferred from the MPU 13 to the register 61 and stored therein when the power source of the device is turned ON. Thereby, a predetermined reset voltage Vr is generated at the reset voltage generation circuit 6.

The respective analog switches 54 and the respective analog switches 55 respectively receive from the control circuit write pulses Wr (see FIG. 3 (d)) and row clocks RCKL (see FIG. 3 (b)) and are turned ON/OFF.

The respective analog switch 41a~43c of the RGB changeover switch circuit 4 respectively receive from the control circuit 12 selection pulses SELa, SELb and SELc and are turned ON/OFF (see FIG. 3 (e)~(g)).

Further, The respective control pulses for the respective analog switches (transmission gates) in the RGB changeover switch circuit 4 include respectively clocks ϕ and the inverted clocks *ϕ produced via an inverter and the respective analog switches receive these pulses and are turned ON/OFF thereby.

However, in the drawing the wirings at the side of inverted clocks *ϕ for the respective analog switches 41a~43c are omitted.

FIG. 2 shows the dot arrangement (diagonal dot arrangement) of the organic EL elements emitting R, G and B for the respective pixel circuits 7 in the organic EL panel 11. In the diagonal arrangement, the order of adjacent three horizontal lines R, G and B in vertical direction is replaced and using the three horizontal lines as a unit, the respective one horizontal lines are repeatedly arranged.

The driving operation of the pixel circuit, primarily the reference current switch operation for such organic EL panel (an organic EL panel having pixels (dots) in diagonal dot arrangement) as shown in FIG. 2 will be explained with reference to the timing chart as shown in FIG. 3. Further, the respective control pulses in FIG. 3 are generated in the control circuit 12.

FIG. 3 (a) shows a row scan start pulse RSTP. In response to the leading up of this pulse, row clocks RCLK as shown in FIG. 3 (b) are generated with a cycle corresponding to the horizontal synchronous signals for video signals and in response thereto, horizontal lines at the row side are successively scanned in vertical direction. Thereby, the line scanning toward vertical direction progressively performed. FIG. 3 (c) shows reset control pulses RS for separating a scanning period and a retracing period in one scan line. "H" period thereof is a reset period RT and "L" period thereof is a light emitting period D of the organic EL.

The analog switches 55 receive a row clock RCLK and are turned ON at the timing of leading up thereof to connect the respective terminal pins Xa~Xn to the output terminal 6a of the reset voltage generation circuit 6, to set capacitors C at the reset voltage Vr in the pixel circuit 7 which are connected via the respective terminal pins Xa~Xn and thus to set the charged voltage of the capacitors C at a voltage level of black.

When the analog switches 55 are turned OFF during the reset period RT at the trailing down timing of a row clock RCLK, a write pulse is generated (see FIG. 3 (d)). The analog switches 54 are turned ON at the leading up timing of the write pulse Wr and the output terminals 5a of the respective D/A converter blocks in the D/A 5 are connected to the respective terminal pins Xa~Xn. Thereby, the capacitors C in the pixel circuit 7 which are connected via the respective terminal pins Xa~Xn are charged at a voltage corresponding to the drive current value.

When a reset control pulse RS trails down and a reset period ends, a write pulse Wr trails down and the analog switches 54 are turned OFF. Thus, the capacitors C in the pixel circuit 7 are connected to the gate of a drive transistor at the timing of trailing down of the reset control pulse RS, a drive transistor Tr to which an organic EL element is connected in series is turned ON and during "L" period of the reset control pulse RS, namely, light emitting period D the organic EL elements of the respective pixel circuits 7 are driven.

FIGS. 3 (e)~(g) show switch signals output from the control circuit 12 in response to the row clocks RCLK and show three selection pulses SELa, SELb and SELc for turning ON/OFF respectively the analog switches 41a~43c in the RGB changeover switch circuit 4. These selection pulses SELa, SELb and SELc are successively generated with a predetermined order in a period of three times with respect to that of the horizontal scan frequency corresponding to the dot arrangement of R, G and B as well as corresponding to the line scanning at the row side (vertical direction scanning) and performs switching of the converted analog current (drive current for the organic EL elements) outputted from the output terminals 5a of the D/A converter blocks corresponding to R, G and B.

Further, the selection pulses SELa, SELb and SELc are respectively obtained from respective digits of a three bits ring counter provided in the control circuit 12 which shifts bit "1" in response to the period of the horizontal frequency. These pulses are signals which are successively rendered "H" in the period (horizontal scanning period) of the row clocks RCLK while using a vertical direction scanning of three horizontal scan lines as a unit.

The selection pulse SELa turns ON the analog switches 41a, 42a and 43a during the period "H", the selection pulse SELb turns ON the analog switches 41b, 42b and 43b during the period "H" and the selection pulse SELc turns ON the analog switches 41c, 42c and 43c during the period "H".

Thereby, when the row line is 1, since the selection pulse SELa is rendered "H" during first horizontal scanning period+retracing period, the white balance adjusting circuit 30R is connected to the D/A 51, the white balance adjusting circuit 30G is connected to the D/A 52 and the white balance adjusting circuit 30B is connected to the D/A 53. As a result, the respective reference currents Ir, Ig and Ib are respectively supplied to the transistors Ta1~Ta3 in the respective D/A 51~53 to respectively drive these transistors Ta1~Ta3.

At the time of the first line scanning at the row side of one horizontal line, the converted analog currents (write currents to the capacitors for drive currents of the organic EL elements) output to the terminal pins Xa~Xn are output under condition of being arranged in the order of R, G, B, R, G, B, . . . (see first horizontal line in FIG. 2) with respect to the terminal pins Xa~Xn. Thereby, at the time of the line scanning of the first horizontal line at the row side the drive currents corresponding to the dot arrangement of R, G, B, R, G, B, . . . are output from the column driver 10 to the terminal pins Xa~Xn of the organic EL panel 11.

In the like manner, when the row line is 2, the selection pulse SELb is rendered "H" during the subsequent horizontal scanning period+retracing period, thus the white balance adjusting circuit 30B is connected to the D/A 51, the white balance adjusting circuit 30R is connected to the D/A 52 and the white balance adjusting circuit 30G is connected to the D/A 53. As a result, the respective reference currents Ir, Ig and Ib are respectively supplied to the transistors Ta1~Ta3 in the respective D/A 51~53 to respectively drive these transistors Ta1~Ta3.

Accordingly, at the time of the second line scanning at the row side of one horizontal line, the converted analog currents output to the terminal pins Xa~Xn are arranged in the order of B, R, G, B, R, G, . . . (see second horizontal line in FIG. 2) with respect to the terminal pins Xa~Xn. Thereby, at the line scanning of the subsequent horizontal line at the row side the drive currents corresponding to the dot arrangement of B, R, G, B, R, G, . . . are output from the column driver 10 to the terminal pins Xa~Xn of the organic EL panel 11 to effect the switching of the drive currents.

In the like manner, when the row line is 3, the selection pulse SELc is rendered "H" during the further subsequent horizontal scanning period+retracing period, thus the white balance adjusting circuit 30G is connected to the D/A 51, the white balance adjusting circuit 30B is connected to the D/A 52 and the white balance adjusting circuit 30R is connected to the D/A 53. As a result, the respective reference currents Ir, Ig and Ib are respectively supplied to the transistors Ta1~Ta3 in the respective D/A 51~53 to respectively drive these transistors Ta1~Ta3. At the time of the third line scanning at the row side of one horizontal line, the converted analog currents output to the terminal pins Xa~Xn are arranged in the order of G, B, R, G, B, R, . . . (see third horizontal line in FIG. 2) with respect to the terminal pins Xa~Xn. Thereby, at the line scanning of the further subsequent horizontal line at the row side the drive currents corresponding to the dot arrangement of G, B, R, G, B, R, . . . are output from the column driver 10 to the terminal pins Xa~Xn of the organic EL panel 11 to effect the switching of the drive current.

The above drive current switching scan of the horizontal lines of line 1~line 3 is repeated every three horizontal lines in response to the line scanning at the row side.

As a result, using the scanning in vertical direction of the three horizontal scan lines as a unit, the reference currents Ir, Ig and Ib are replaced in the order of R, G and B, B, R and G and G, B and R, successively selected and respectively applied to the D/A 51, D/A 52 and D/A 53, thus the drive currents corresponding respectively to R, G and B of the organic EL elements in the diagonal dot arrangement on the organic EL panel 11 as shown in FIG. 2 are generated in response to the vertical scanning on every one horizontal line and the organic El elements are respectively driven.

Now, in the present embodiment, although the reset voltage generation circuit 6 is provided one in number common for R, G and B, the circuit can be provided separately for respective R, G and B. In such instance, three reset voltage generation circuits are preferably provided for R, G and B. The respective output terminals of these three reset voltage generation circuits are connected alternatively to the terminal pins Xa~Xn in two pins apart via changeover switch circuits like the RGB changeover switch circuit 4. Thereby, using the converted analog current for R, G and B as the drive currents, the reset voltages for the respective terminal pins Xa-Xn are selectively switched in response to switching of the RGB changeover switch circuit 4.

INDUSTRIAL APPLICABILITY

Although in the present embodiment as has been explained hitherto the converted analog currents are directly outputted to the terminal pins Xa~Xn as the drive currents (write current to the capacitors used as the drive current for the organic EL elements), the currents can be outputted via an output stage current source. Such output stage current source can be provided between the respective output terminals 5a and the analog switch 54 or between the analog switch 54 and the terminal pins Xa-Xn. Further, since the output current of such output stage current source is usually a discharge current, it is preferable to be applied to a passive matrix type EL panel.

Further, the terminal pins Xa~Xn can be constituted by providing a plurality of column drivers and by allotting respectively thereto. In such instance, one column driver is assigned many terminals, in that a part of the terminal pins Xa~Xn.

Further, although in the present embodiment as the dot arrangement on the display screen, the diagonal arrangement is exemplified, when the arrangement are such as the delta arrangement and the rectangular arrangement, it is sufficient when a changeover switch circuit corresponding thereto of the reference currents for R, G and B is provided. Accordingly, the present invention is, of course, applicable even to such as the delta arrangement and the rectangular arrangement.

Although the respective transistors in the present embodiment are constituted by MOS transistors, the transistors can be, of course, constituted by bipolar transistors.

Further, although the present embodiment exemplifies to drive the active matrix type organic EL panel, the present invention is, of course, applicable when driving a passive type organic EL panel.

EXPLANATION OF REFERENCE NUMERALS

Figure 1:
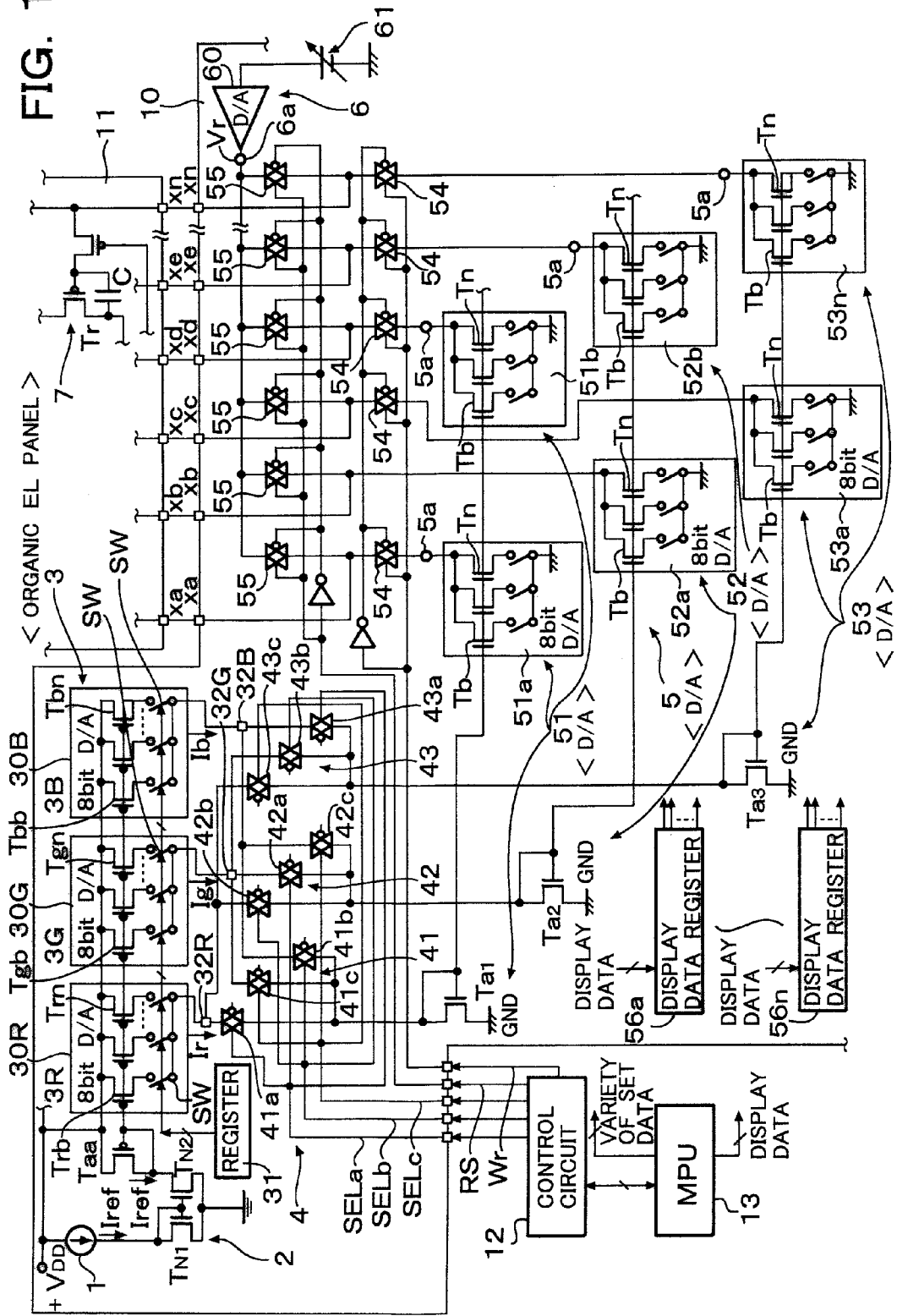
FIG. 1 is a block diagram primarily of a column driver in an active matrix type organic EL panel of a diagonal dot arrangement according to an embodiment to which an organic EL drive circuit of the present invention is applied.
Figure 2:
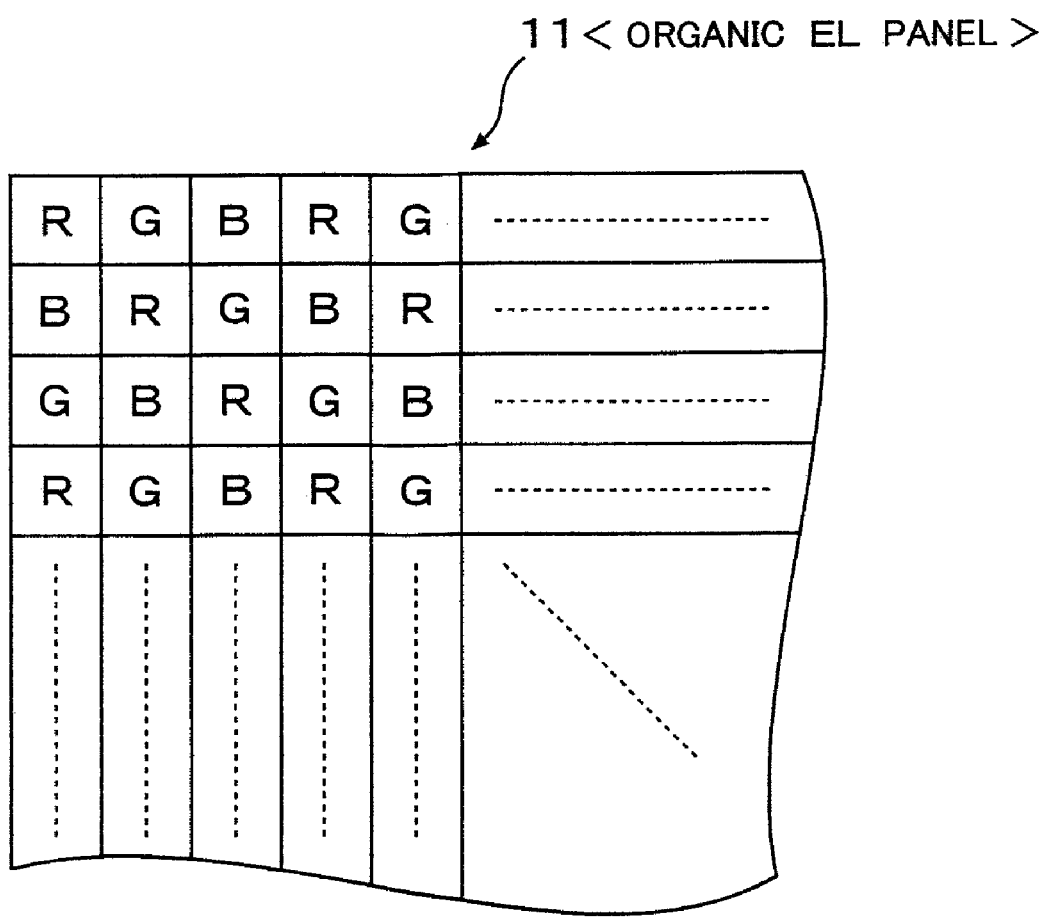
FIG. 2 is a view for explaining a pixel arrangement (dot arrangement) in the diagonal arrangement.
Figure 3:
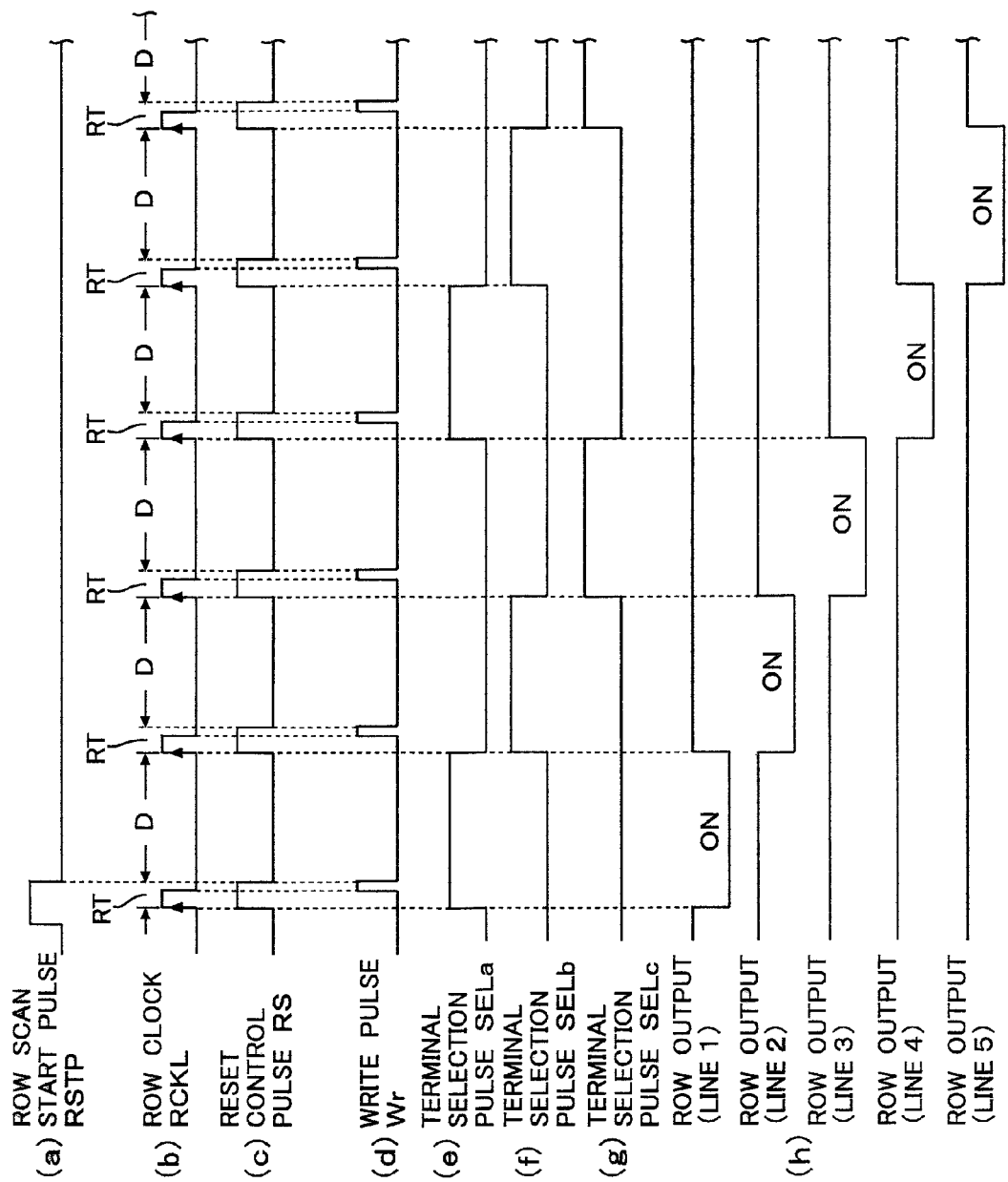
FIG. 3 is a timing chart of the column driver when driving the active matrix type organic EL panel.

1 . . . Reference current source,
2 . . . Current inverting circuit,
3, 3R, 3G, 3B . . . White balance adjusting circuit,
4 . . . RGB changeover switch circuit,
5 . . . D/A converter circuit (D/A),
6 . . . Reset voltage generation circuit,
10 . . . Column IC driver,
11 . . . Active matrix type organic EL panel,
12 . . . Control circuit,
13 . . . MPU,
30R, 30G, 30B . . . D/A converter block,
31 . . . Register,
32R, 32G, 32B . . . Output terminal of reference voltage,
41a~41c, 42a~42c, 43a~43c, 51a~51n, 52a~52n, 53a~53n, 54, 55 . . . Analog switch,
56a~56n . . . Display data register,
T1~T5, Ta~Tm . . . N channel MOS transistor,
Taa, Trb~Trn, Tgb~Tgn, Tbb~Tbn . . . P channel MOS transistor.

The invention claimed is:

1. A reference current generation circuit in an organic EL drive circuit which respectively produces drive currents corresponding to respective many terminal pins in an organic EL panel and current-drives the organic EL panel comprising:

a first, a second and a third D/A converter block, each of which is constituted by a plurality of switch circuits and a plurality of output side transistors of a current mirror circuit, provided for one of corresponding three primary colors of R, G and B and respectively generates converted analog current as a reference current, a first changeover switch circuit which selects one of respective reference currents corresponding to R, G and B, a second changeover switch circuit which selects another of respective reference currents corresponding to R, G and B, a third changeover switch circuit which selects the remaining one of respective reference currents corresponding to R, G and B and a control circuit for performing a control which successively switches in response to line scanning for a display screen the selection of the reference current by the first, the second and the third changeover switch circuit so that drive currents generated corresponding to respective terminal pins correspond to a dot arrangement of R, G and B in the organic EL panel.

2. A reference current generation circuit according to claim 1, wherein the number of the current mirror circuit is one and the first, the second and the third D/A converter block are provided in the single current mirror circuit.

3. A reference current generation circuit according to claim 2, wherein the current mirror circuit constitutes a D/A converter circuit which selects through switching output currents of the plurality of output side transistors by the plurality of switch circuits and the first, the second and the third converter block are white balance adjusting circuits provided respectively corresponding to R, G and B which adjust white balance of R, G and B on the display screen.

4. A reference current generation circuit according to claim 3, wherein the white balance adjusting circuits receive respective set data, D/A convert the set data and generate the respective reference currents adjusted corresponding to R, G and B.

5. A reference current generation circuit according to claim 4, further comprising a reference current source and a current inverting circuit and wherein the first, the second and the third changeover switch circuit are respectively constituted by three switch transistors which are turned ON/OFF so as to successively select the reference currents corresponding to R, G and B by a control signal from the control circuit and an input side transistor in the current mirror circuit receives current from the reference current source via the current inverting circuit.

6. A reference current generation circuit according to claim 5, wherein the switch transistors are transmission gates and the control signal is a pulse having a period of three times with regard to that of horizontal scanning frequency for selecting the reference currents.

7. A reference current generation circuit according to claim 6, wherein the plurality of the respective switch circuits in the first, the second and the third converter block are turned ON/OFF in response to the set data and the current mirror circuit is constituted by P channel MOS transistors.

8. An organic EL display device comprising an organic EL drive circuit including a reference current generation circuit according to claim 1 and the organic EL panel.

9. An organic EL drive circuit which respectively produces drive currents corresponding to respective many terminal pins in an organic EL panel and current-drives the organic EL panel comprising:

a reference current generation circuit which respectively generates reference current corresponding to display three primary colors of R, G and B, a first, a second and a third current mirror circuit, first D/A converter blocks in many numbers which are constituted by a plurality of first switch circuits and a plurality of output side transistors for the respective first, second and third current mirror circuit, generate converted analog currents as the drive currents or currents on which the drive currents are generated, and are provided for respective many terminal pins, a first changeover switch circuit which selects one of the respective reference current corresponding to R, G and B and supplies the same to an input side transistors for the first current mirror circuit, a second changeover switch circuit which selects another of the respective reference current corresponding to R, G and B and supplies the same to an input side transistors for the second current mirror circuit, a third changeover switch circuit which selects the remaining one of the respective reference current corresponding to R, G and B and supplies the same to an input side transistors for the third current mirror circuit and a control circuit for performing a control which successively switches in response to line scanning for a display screen the selection of the reference currents by the first, the second and the third changeover switch circuit, thereby, the drive currents generated corresponding to respective terminal pins are output to the respective terminal pins through the switching control of the control circuit so as to correspond to a dot arrangement of R, G and B in the organic EL panel.

10. An organic EL drive circuit according to claim 9, wherein the first, the second and the third changeover switch circuit are respectively constituted by three switch transistors which are turned ON/OFF so as to successively select the reference currents corresponding to R, G and B by a control signal from the control circuit, the reference current generation circuit further includes a plurality of second switch circuits and a fourth current mirror circuit and the plurality of second switch circuits and a plurality of output side transistors of the fourth current mirror circuit form a second, a third and a fourth D/A converter block for R, G and B.

11. An organic EL drive circuit according to claim 10, wherein the fourth current mirror circuit constitutes a D/A converter circuit which selects through switching output currents of the plurality of output side transistors in the fourth current mirror circuit by the plurality of second switch circuits and the second, the third and the fourth converter block are white balance adjusting circuits provided respectively corresponding to R, G and B which adjust white balance of R, G and B on the display screen.

12. An organic EL drive circuit according to claim 11, wherein the white balance adjusting circuits receive respective set data, D/A convert the set data and generate the respective reference currents adjusted corresponding to R, G and B.

13. An organic EL drive circuit according to claim 12, wherein the plurality of the respective second switch circuits in the second, the third and the fourth converter block are turned ON/OFF in response to the set data.

14. An organic EL drive circuit according to claim 13, wherein the reference current generation circuit further comprising a reference current source and a current inverting circuit and wherein an input side transistor in the fourth current mirror circuit receives current from the reference current source via the current inverting circuit and the first, the second and the third changeover switch circuit are respectively constituted by three switch transistors which are turned ON/OFF so as to successively select the reference currents corresponding to R, G and B by a control signal from the control circuit.

15. An organic EL drive circuit according to claim 14, wherein the switch transistors are transmission gates and the control signal is a pulse having a period of three times with regard to that of horizontal scanning frequency for selecting the reference currents.

16. An organic EL drive circuit according to claim 15, wherein the first D/A converter block receives display data and generates the converted analog current, the organic EL panel is an active matrix type and the dot arrangement is a diagonal dot arrangement.

17. An organic EL drive circuit according to claim 16, wherein the first, the second and the third current mirror circuit are constituted by N channel MOS transistors, the fourth current mirror circuit is constituted by P channel MOS transistors and the respective terminal pins are connected to a constant voltage circuit which generates a reset voltage via third switch circuits.

18. An organic EL display device comprising an organic EL drive circuit according to claim 9 and the organic EL panel.

\* \* \* \* \*